United States Patent
Arnold et al.

(10) Patent No.: US 12,206,386 B2
(45) Date of Patent: Jan. 21, 2025

(54) RADIO-FREQUENCY ASSEMBLY WITH IMPEDANCE MATCHING FILTER

(71) Applicant: Tesat-Spacecom GmbH & Co. KG, Backnang (DE)

(72) Inventors: Christian Arnold, Backnang (DE); Benjamin Falk, Backnang (DE); Maria Wochner, Backnang (DE); Sebastian Bartz, Backnang (DE); Michael Glasbrenner, Backnang (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 278 days.

(21) Appl. No.: 17/858,189

(22) Filed: Jul. 6, 2022

(65) Prior Publication Data

US 2023/0010012 A1 Jan. 12, 2023

(30) Foreign Application Priority Data

Jul. 8, 2021 (DE) .......................... 102021117730.8

(51) Int. Cl.
*H03H 7/40* (2006.01)
*H03F 3/189* (2006.01)
(Continued)

(52) U.S. Cl.
CPC ............... *H03H 7/40* (2013.01); *H03F 3/189* (2013.01); *H03F 3/54* (2013.01); *H04B 1/0458* (2013.01)

(58) Field of Classification Search
CPC ........ H03H 7/40; H03H 9/0004; H03F 3/189; H03F 3/54; H04B 1/0458
(Continued)

(56) References Cited

U.S. PATENT DOCUMENTS 3,609,571 A 9/1971 Klein et al.
8,374,561 B1 * 2/2013 Yung ................ H04B 1/0458
455/120

(Continued)

FOREIGN PATENT DOCUMENTS

DE       1198868 B   8/1965
EP       2 775 612 A1  9/2014
JP       6356490 B2   7/2018

OTHER PUBLICATIONS

Extended European Search Report for Application No. 22180884.3 dated Nov. 11, 2022, 3 pages. [See p. 2, categorizing the cited references].

*Primary Examiner* — Hai L Nguyen
(74) *Attorney, Agent, or Firm* — Lerner David LLP

(57) ABSTRACT

A radio-frequency assembly is described which can be used in communication satellites, for example. The radio-frequency assembly contains a signal source in the form of a semiconductor amplifier output, an impedance matching filter, and a radio-frequency waveguide. The impedance matching filter is connected to the semiconductor amplifier output on the input side and to the radio-frequency waveguide on the output side. The impedance matching filter has a different impedance value on the input side from that on the output side and is matched to the semiconductor amplifier output on the input side and matched to the radio-frequency waveguide on the output side. Consequently, a separate matching circuit between semiconductor amplifier output and radio-frequency waveguide is no longer necessary.

15 Claims, 5 Drawing Sheets

(51) Int. Cl.
    *H03F 3/54*           (2006.01)
    *H04B 1/04*           (2006.01)

(58) Field of Classification Search
    USPC .......................................................... 333/17.3
    See application file for complete search history.

(56) References Cited

U.S. PATENT DOCUMENTS

| | | |
|---|---|---|
| 9,530,604 B2 | 12/2016 | Katz et al. |
| 2003/0227575 A1 | 12/2003 | Plonka |
| 2009/0219107 A1 | 9/2009 | Woods et al. |
| 2012/0007666 A1 | 1/2012 | David et al. |
| 2019/0260460 A1 | 8/2019 | Ashworth et al. |

\* cited by examiner

RADIO-FREQUENCY ASSEMBLY WITH IMPEDANCE MATCHING FILTER

FIELD OF THE INVENTION

The present description relates to radio-frequency technology. In particular, the description relates to a radio-frequency assembly with an impedance matching filter arranged between two components having different impedances. Furthermore, the description relates to an antenna arrangement with one or a plurality of such radio-frequency assemblies, wherein the radio-frequency assemblies can be used for example as part of a communication device or of a data transmission link, in particular of a satellite transmission link or of a satellite radio transmission link. Last but not least the description relates to a satellite with such an antenna arrangement.

BACKGROUND OF THE INVENTION

Systems from the field of radio-frequency technology are used to transmit signals and data from a transmitting station to a receiving station. Radio-frequency technology is preferably used if data have to be transmitted over a great distance (up to several hundred or several thousand kilometres).

Before signals are transferred to the air interface (e.g. antenna), they may require processing, amplification, or conditioning, for example. Radio-frequency technology is used on communication satellites, for example, in order to amplify, combine and filter communication signals.

A radio-frequency system often consists of individual modules (low noise amplifiers, also referred to as LNAs, filters, couplers, isolators, preamplifiers, power amplifiers, etc.) connected to one another. Matching is often necessary at the connection between two modules that are directly connected to one another. Power matching is usually effected by the impedances of the modules connected to one another being matched to one another.

EP 2 775 612 A1 and U.S. Pat. No. 9,530,604 B2 describe a signal transmission unit which is employed in the radio-frequency range and finds use in a communication satellite, in particular.

BRIEF SUMMARY OF THE INVENTION

A problem addressed can be considered that of improving the efficiency of a radio-frequency assembly.

In accordance with one aspect, a radio-frequency assembly, also referred to as RF assembly, is specified. The RF assembly has a signal source, an impedance matching filter and a radio-frequency waveguide, also referred to as RF waveguide. The signal source has a semiconductor amplifier output. The impedance matching filter has a first interface and a second interface. The first interface is communicatively coupled to the signal source in order to be able to transmit an RF signal from the signal source to the impedance matching filter. The second interface is communicatively coupled to the RF waveguide in order to be able to transmit an RF signal from the impedance matching filter to the RF waveguide. A first impedance value at the first interface corresponds to an impedance value at the semiconductor amplifier output (this optimum impedance for the output of the semiconductor amplifier is generally complex-valued, that is to say consists of magnitude and phase). A second impedance value at the second interface corresponds to an impedance value at the RF waveguide. The first impedance value and the second impedance value have different values.

In other words, the impedance matching filter has a different impedance value on the input side (at the interface to the semiconductor amplifier output) from that on the output side (at the interface to the RF waveguide) and is designed on the input side such that an optimum impedance for the desired operating situation (maximum efficiency, maximum gain, maximum linearity, maximum output power) is presented to the semiconductor amplifier output, and is matched to the radio-frequency waveguide on the output side, mention being made here in particular of power matching for optimum efficiency. Consequently, a separate matching circuit between semiconductor amplifier output and radio-frequency waveguide is no longer necessary because, besides its filter function, the impedance matching filter also performs the matching to the respectively connected components. Likewise, a dedicated hollow waveguide junction is no longer necessary since the filter has a hollow waveguide output. Furthermore, dedicated blocking capacitors for DC blocking (for removing DC components from the RF signal) can also be dispensed with, since the impedance matching filter has a capacitive input coupling.

The semiconductor amplifier output is a semiconductor component, for example a transistor, which outputs an RF signal that is fed to the impedance matching filter.

The impedance matching filter has two functions. A first function is that the impedance matching filter fulfils the function of a frequency filter and functions as a bandpass filter, for example. A second function is that the impedance matching filter is matched to the impedance of the semiconductor amplifier output at its first interface and is matched to the impedance of the RF waveguide at the second interface. This matching is preferably power matching, that is to say that the impedance value of the first interface corresponds to the impedance value of the amplifier output and the impedance value of the second interface corresponds to the impedance value of the RF waveguide.

Consequently, power losses as a result of the required impedance matching are reduced since the impedance matching filter using hollow waveguide technology has considerably lower losses than, for example, a microstrip matching structure realized on the power amplifier substrate or a PCB. Furthermore, this construction of the RF assembly makes it possible to dispense with a separate matching circuit. Rather, the matching is effected in the impedance matching filter. The number of components is reduced, which reduces both the energy demand and the thermal load. Overall, the power efficiency (as a ratio of output power to input power relative to the RF assembly) is improved by virtue of the construction described here. The impedance values discussed herein are preferably complex values and relate in each case to magnitude and phase at the respective positions in the RF assembly. Furthermore, the filter is designed so as to enable compensation of structures (e.g. wire bonds, microstripline) necessary for the mechanical connection between filter and amplifier.

A communicative coupling between the first interface and the signal source, and respectively between the second interface and the RF waveguide, means that these two couplings are configured such that electrical and/or electromagnetic signals can be transmitted. This does not necessarily presuppose that there is a galvanic, electrically conductive connection between the components mentioned. Rather, signals, in particular RF signals, can also be transmitted via a capacitive coupling. The capacitive coupling allows dedicated blocking capacitors in the RF path to be dispensed with and thus likewise reduces the RF losses by the portion caused by the capacitors.

In accordance with one embodiment, the semiconductor amplifier output has a lower impedance value than the RF waveguide.

Semiconductor amplifier outputs, for example in the form of transistors, typically have a real impedance value of between 10 and 30 ohms. By contrast, RF waveguides in the form of coaxial lines or hollow waveguides typically have a real impedance value of approximately 50 ohms or more.

The impedance matching filter accomplishes matching between these components with their different impedance values.

In accordance with a further embodiment, the impedance matching filter is configured as a hollow waveguide with at least one resonator and/or at least one window.

The impedance matching filter is preferably configured using hollow waveguide technology. Therefore, it is distinguished by a high efficiency or low losses, as a result of which the power efficiency of the RF assembly overall becomes better.

The resonators and/or windows are components of the impedance matching filter which, by virtue of their construction and their configuration, influence the filter function and the characteristic impedance of the impedance matching filter.

In accordance with a further embodiment, the impedance matching filter has a plurality of resonators and/or a plurality of windows which are arranged one behind another along a signal propagation direction in the impedance matching filter.

The plurality of resonators and/or windows which are arranged one behind another and spaced apart from one another provide for matching of the impedance of the impedance matching filter and also serve to implement the filter function.

Preferably, a window is arranged in each case between two resonators arranged one behind another, wherein a window corresponds to a cross-sectional constriction of the impedance matching filter.

In accordance with a further embodiment, the plurality of resonators arranged one behind another along the signal propagation direction differ from one another in terms of their geometry along the signal propagation direction.

This means that the resonators have different extents and/or shapes. By way of example, resonators arranged one after another can have different heights, material thicknesses and/or shapes. This achieves the matching to the impedance values of the amplifier output, on the one hand, and of the RF waveguide, on the other hand.

The resonators are configured such that at least two resonators have different geometries. However, it is also conceivable for each resonator to have a geometry (dimension, shape, etc.) that occurs only once in the impedance matching filter.

In accordance with a further embodiment, the impedance matching filter is configured as a hollow waveguide with one ridge or without a ridge.

In accordance with a further embodiment, said one ridge has a plurality of ridge sections, wherein the ridge sections have different geometries.

The ridge sections are arranged one behind another in the signal propagation direction. In particular, the ridges are arranged in a manner directly adjoining one another. The ridge sections have a different height and/or width, for example. The plurality of differently configured ridge sections arranged one behind another provide for matching of the impedance of the impedance matching filter because the differently configured ridge sections have different characteristic impedances.

In accordance with a further embodiment, the RF assembly furthermore has a baseplate, wherein the semiconductor amplifier output is arranged on the baseplate and is galvanically coupled via one or more lines to a transmission path on the baseplate. The transmission path has a capacitive coupling element situated opposite the first interface and arranged for capacitively coupling RF signals into the first interface.

The capacitive coupling element is galvanically isolated from the first interface and spaced apart therefrom by a gap. RF signals in a frequency range of a plurality of GHz are fed from the semiconductor amplifier output into the transmission path and the capacitive coupling element. On account of the high frequencies, these signals are fed capacitively, i.e. without galvanic connection, from the capacitive coupling element into the first interface of the impedance matching filter.

Since the semiconductor amplifier output is galvanically isolated from the impedance matching filter, a direct current component of the RF signal or a direct current present at the transmission path and/or the coupling element is prevented from being transmitted from the transmission path or from the capacitive coupling element to the impedance matching filter.

The baseplate is usually a circuit board or a PCB (abbreviation of: printed circuit board).

In accordance with a further embodiment, the RF assembly furthermore has a power source, which is galvanically coupled to the transmission path and is embodied for passing an energy supply in the form of direct current, DC, onto the transmission path and providing it via said one or more lines to the semiconductor amplifier output.

The DC power is taken up as operating energy by the semiconductor amplifier output, for example the transistor. This involves direct current. The direct current is transmitted via the same transmission path as the RF signal.

In accordance with a further embodiment, the power source has a DC filter configured to be non-transmissive for RF signals on the transmission path.

The DC filter is configured as a low-pass filter, for example. Consequently, the DC filter allows direct current signals to pass and is non-transmissive for RF signals. The DC filter is non-transmissive for the RF signals on the transmission path, i.e. the useful signals output by the semiconductor amplifier output, and so the DC energy supply has no appreciable influence on the impedance value of the semiconductor amplifier output and the behaviour vis-à-vis RF signals.

In accordance with a further embodiment, the RF assembly has a plurality of semiconductor amplifier outputs capacitively coupled to the first interface of the impedance matching filter.

In this embodiment, a plurality of semiconductor amplifier outputs are coupled to one impedance matching filter. The power fed into the impedance matching filter is thus multiplied. A combination or a multiplication of the power is effected on the input side of the impedance matching filter in this variant.

In accordance with a further embodiment, the RF assembly has a plurality of impedance matching filters, each of which is coupled to at least one semiconductor amplifier output, wherein the plurality of impedance matching filters are coupled to a single RF waveguide.

As an alternative or in addition to the previous embodiment, a power combination is effected on the output side of the impedance matching filter in this embodiment. This embodiment also serves to multiply the power that is output. The plurality of impedance matching filters are connected to the same RF waveguide on the output side, i.e. at their respective second interface. It is conceivable for the respective second interfaces firstly to be connected to one another and then for a common output of the plurality of impedance matching filters to be led to a single RF waveguide. Alternatively, the respective second interfaces are individually coupled to the RF waveguide. Two or more impedance matching filters, on the output side, can be coupled to a so-called 3 dB coupler and be led to the RF waveguide.

In accordance with a further embodiment, the RF waveguide is a hollow waveguide, a ridge hollow waveguide, or a coaxial conductor.

In accordance with a further aspect, an antenna arrangement is specified. The antenna arrangement has an antenna and a plurality of RF assemblies as described herein. The plurality of RF assemblies are connected to the antenna in order to transmit a useful signal to the antenna.

In accordance with a further aspect, a communication satellite having an antenna arrangement as described herein is specified.

The antenna arrangement is part of a data transmission link in the communication satellite, for example. A communication satellite is a spacecraft provided for use in Earth's orbit and containing a communication station for receiving and transmitting data or signals. In addition, a communication satellite can also contain units for processing the data. The RF assembly can preferably be used in a signal processing path of the communication station of the communication satellite.

In the context of this description, i.e. in relation to the RF assembly, the antenna arrangement and the communication satellite, radio frequency should be understood to mean a frequency range above one GHz (gigahertz, 1×10E9 hertz). Such frequency ranges are used in satellite radio transmission links, for example. Such a satellite radio transmission link can be for example a Ka-band transmission link in a frequency range of 17.7-21.2 GHz for the downlink and 27.5-31 GHz for the uplink, a Ku-band or X-band implementation in the range around 11 and 7 GHZ, respectively, or an L-band (around 1.5 GHZ), S-band (around 2.5 GHZ) or C-band implementation (around 4 GHZ).

The semiconductor amplifier output can be a component of an amplifier that is connected upstream of the antenna. By way of example, a high-power transistor amplifier can be used as amplifier. A high-power transistor amplifier may also be referred to as a solid-state power amplifier (SSPA). This type of amplifier is used as an alternative or in addition to so-called travelling wave tube amplifiers at high frequencies. SSPAs are available in various power classes and for very high frequency bands. By way of example, SSPAs can be used in the following frequency bands: C-, X-, Ku-, Ka- and Q-band.

BRIEF DESCRIPTION OF THE DRAWINGS

Exemplary embodiments of the invention are discussed in greater detail below with reference to the accompanying drawings. The illustrations are schematic and not true to scale. Identical reference signs refer to identical or similar elements. In the figures.

DETAILED DESCRIPTION

Figure 1:
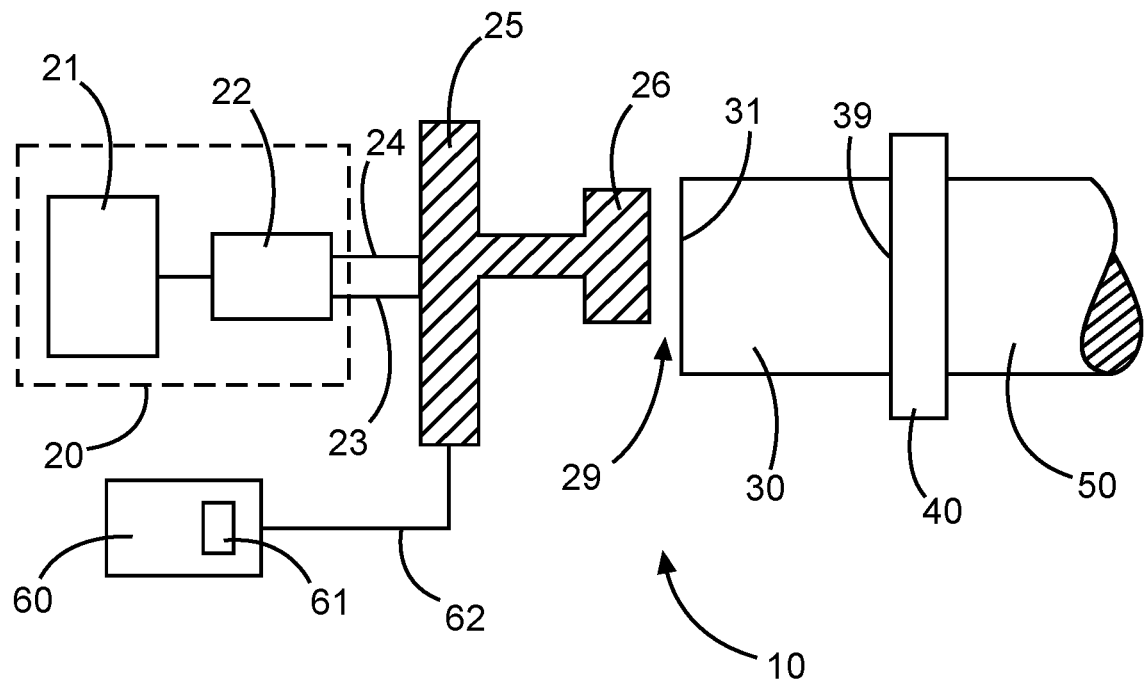
FIG. 1 shows a schematic illustration of an RF assembly.

FIG. 1 shows a schematic illustration of an RF assembly 10. The RF assembly 10 has a signal source 20. The signal source 20 outputs a signal that follows a signal transmission path. The signal transmission path runs from left to right in the illustration in FIG. 1. In this case, an RF signal is output firstly from the signal source 20 via the first line 23 and the second line 24 to the transmission path 25 and the capacitive coupling element 26. From the capacitive coupling element 26, the RF signal is fed capacitively, i.e. wirelessly, into the first interface 31 of the impedance matching filter 30. The RF signal propagates via the impedance matching filter 30 to the second interface 39, from where the RF signal is fed into the RF waveguide 50.

A power source 60, for example in the form of a direct-current supply, is connected to the transmission path 25 via a connecting line 62. A direct-current energy supply is passed from the power source 60 to the transmission path 25 and from there via the first line 23 and the second line 24 to the semiconductor amplifier output 22. Both an RF signal and the energy supply for the semiconductor amplifier output 22 are thus transmitted via the first line 23 and the second line 24. The power source 60 also has a direct-current filter (DC filter) 61. The direct-current filter 61 has the function of allowing direct current to pass and not allowing RF signals to pass, or greatly damping the latter.

The signal source 20 is a power amplifier, for example, and consists of an amplifier unit 21 and a semiconductor amplifier output 22. The semiconductor amplifier output 22 is a transistor, for example, which outputs a signal amplified by the amplifier unit 21. In this respect, the semiconductor amplifier output 22 can be provided in a manner integrated into the amplifier unit 21 or separately therefrom.

In this example, the signal source 20 is a radio-frequency power amplifier module. Radio-frequency power amplifier modules are often used in satellite communication. They are used to bring a transmission signal to the required power level in order to obtain signal levels that are still capable of being received at a remote station, e.g. on Earth. Historically, vacuum tube amplifiers have been used for this purpose-particularly at higher frequencies above 6 GHz. These amplifiers have outstanding properties, in particular high efficiency (as measured by a low DC energy consumption for the available RF output power) with good linearity (low distortion of the signal). Particularly for use in so-called active antennas, i.e. electronically controllable antennas, semiconductor-based amplifiers have major advantages however, particularly with regard to dimensions and costs. In the case of an active antenna, a large number of rather low-power amplifiers are required, since each antenna element requires a dedicated amplifier. However, a high linearity together with very high power efficiency is also required. Traditional semiconductor-based amplifiers generally have some deficiencies here, however. This results not only in a high energy consumption, but also in high evolution of heat. This can make the thermal design of the antenna more difficult or even impossible. These disadvantages are overcome by the construction of the RF assembly proposed here for application in active antennas. It goes without saying that high efficiency is desirable for other amplifier applications too, and the present RF assembly can readily also be used for other power amplifier applications (e.g. gateway amplifiers, channel amplifiers, etc.).

Integrated components using GaN or GaAs technology can be used in the amplifier unit 21 and the semiconductor amplifier output 22 of the signal source 20.

The RF assembly described here can be used for example in an active antenna module with a bandwidth of 17.8-20.2 GHZ (in the Ka-band). However, transfer to other amplifier applications and frequencies is possible without any problems (e.g. Ku-band 10.7-12.7 GHZ, Q-band 37.5-42.5 GHZ), provided that suitable transistors are available. The RF assembly can be configured such that it satisfies a linearity requirement (given by 17 dB NPR-noise power ratio) and an efficiency requirement of >30% (for the output stage, given by a max. total antenna power of approximately 600 W for a plurality of amplifier paths) for given dimensions of approximately 7×3 mm^2 for an individual amplifier channel.

The signal source 20 is connected to a transmission path 25 by means of two lines 23, 24, such that electromagnetic signals can be transmitted inductively from the amplifier output 22 to the transmission path 25. The transmission path 25 is a conductor track on a circuit board, for example. The transmission path 25 transitions to a capacitive coupling element 26. The capacitive coupling element 26 is for example directly connected to the transmission path 25 or these two elements are part of the same conductor track on the circuit board.

Figure 4:
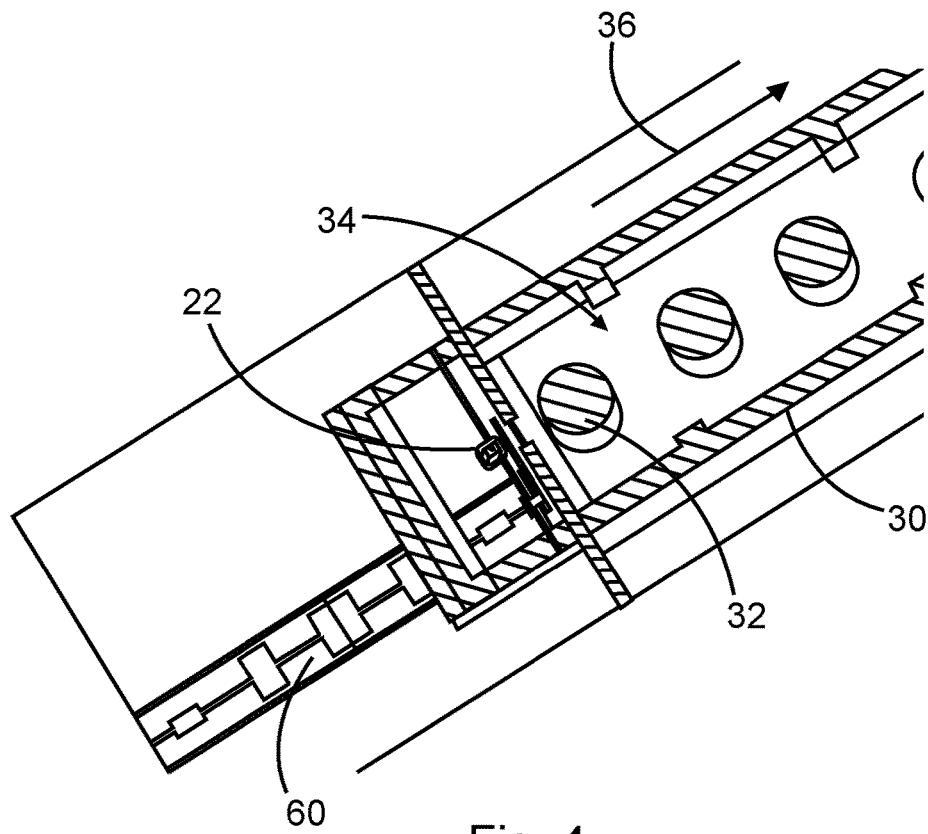
FIG. 4 shows a schematic illustration of the connection between an RF amplifier output and an impedance matching filter.
Figure 5:
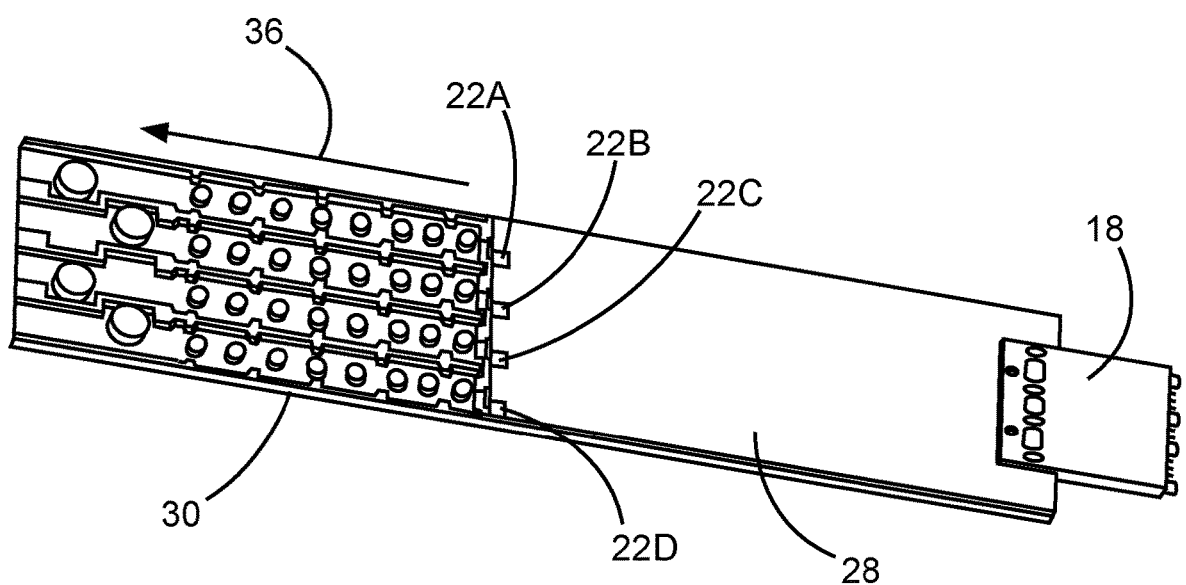
FIG. 5 shows a schematic illustration of a connection between an RF amplifier output and an impedance matching filter with a plurality of branches.
Figure 6:
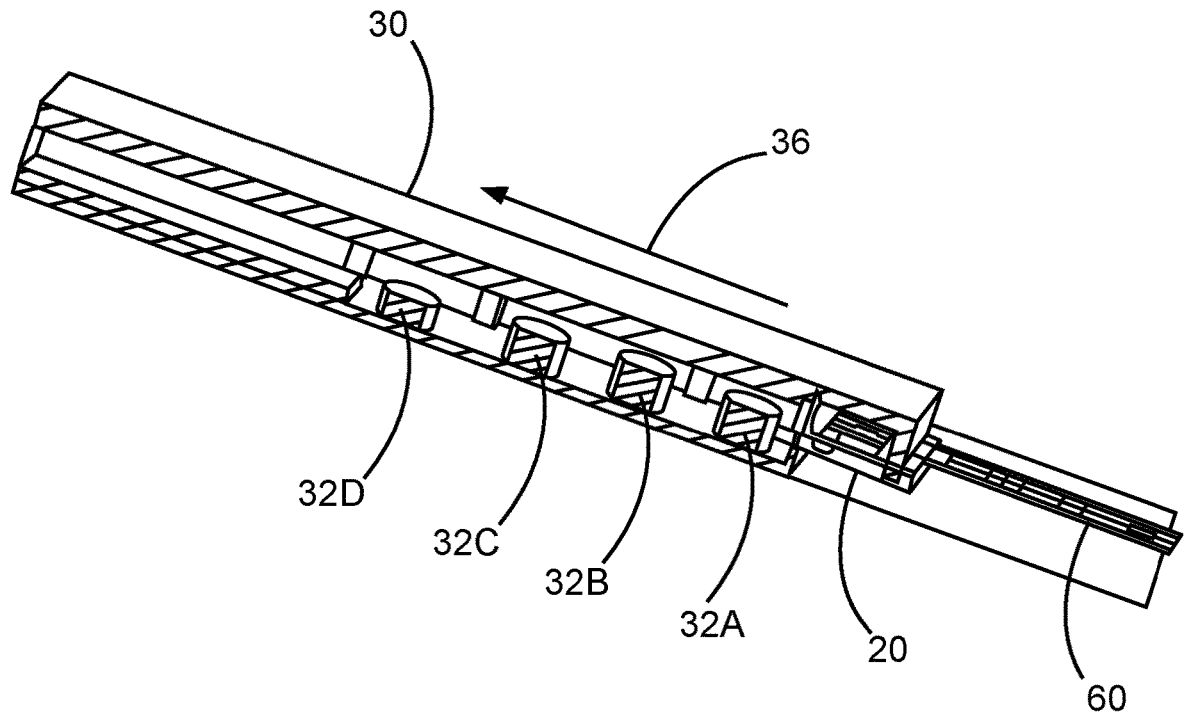
FIG. 6 shows a schematic isometric illustration of the connection between an RF amplifier output and an impedance matching filter with a plurality of resonators.
Figure 8:
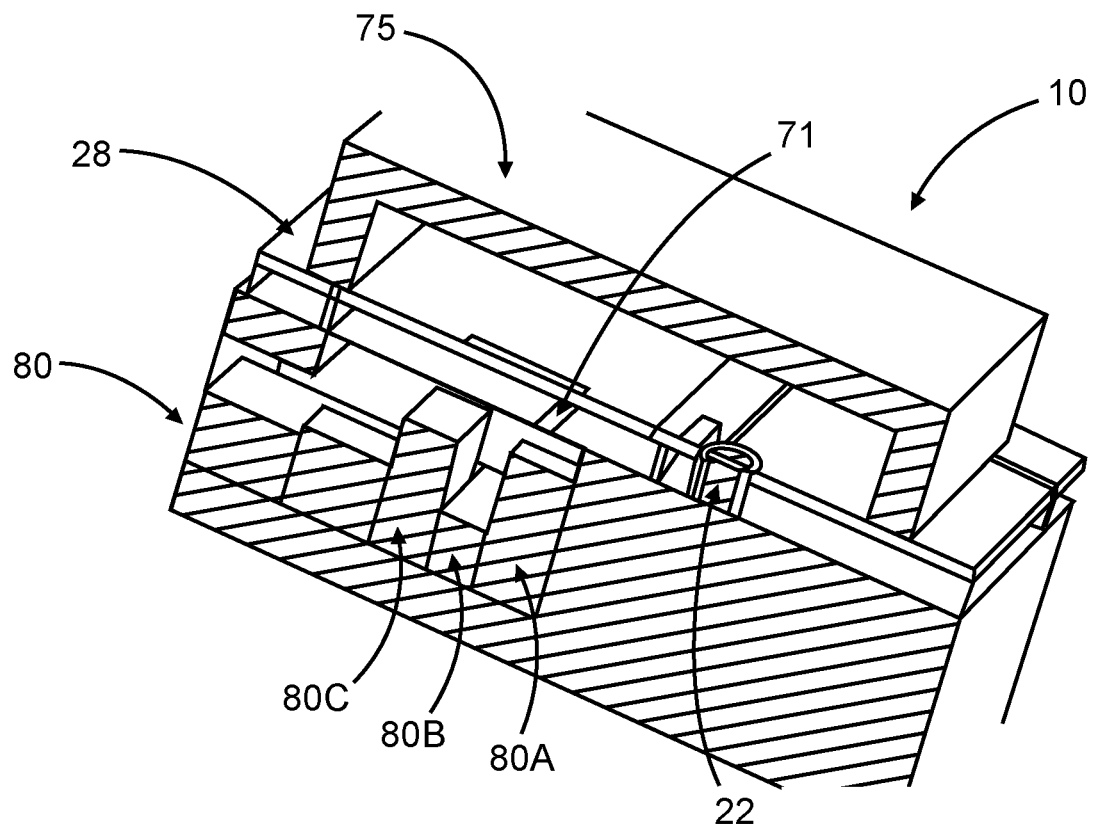
FIG. 8 shows a schematic illustration of an RF assembly with an impedance matching filter in the form of a ridge hollow waveguide with a plurality of ridge sections.

An individual transistor using GaN (or GaAs) technology is used as semiconductor for the amplifier output 22, specifically without an integrated matching and stabilizing network. Particularly the matching at the output of the transistor is produced by way of a hollow waveguide structure (namely the impedance matching filter 30). Two variants are conceivable here. A first variant is illustrated in FIGS. 4 to 6 with a filter with resonators and windows, and a second variant is shown in FIG. 8 with a ridge hollow waveguide.

The input coupling into the hollow waveguide structure of the impedance matching filter is effected as directly as possible. A short piece of PCB/ceramic substrate or alternatively a coaxial structure is conceivable for this. The direct-current supply of the transistor functioning as amplifier output is either fed via a filter (in which case blocking using capacitances that is otherwise customary can be positioned at the input of the filter) or blocked using capacitors. Consequently, a further direct-current barrier is no longer necessary on the RF line (first line 23, second line 24) since the input coupling of the RF signal into the hollow waveguide structure of the impedance matching filter is effected capacitively.

The impedance matching filter 30 is coupled to the RF waveguide 50 by means of a coupling unit 40. The coupling unit 40 can be for example a flange or some other connection.

The impedance matching filter 30 is fabricated using hollow waveguide technology and has the function of filtering signals output by the amplifier output 22 and effecting matching to the amplifier output 22, on the one hand, and also matching to the RF waveguide 50, on the other hand. As a result of this construction, the number of components required for a matching circuit is reduced, which improves the efficiency of the RF assembly 10 and provides a high linearity. In particular, it is possible to dispense with a matching network that otherwise, in the case of semiconductor amplifiers, is usually used at the output of the amplifier. Such a matching network usually results in high losses, which reduces the efficiency of the amplifier.

These disadvantages are avoided by the impedance matching filter 30 being configured using hollow waveguide technology and a capacitive junction being used as a barrier for direct-current portions between the amplifier output and the impedance matching filter.

Figure 2:
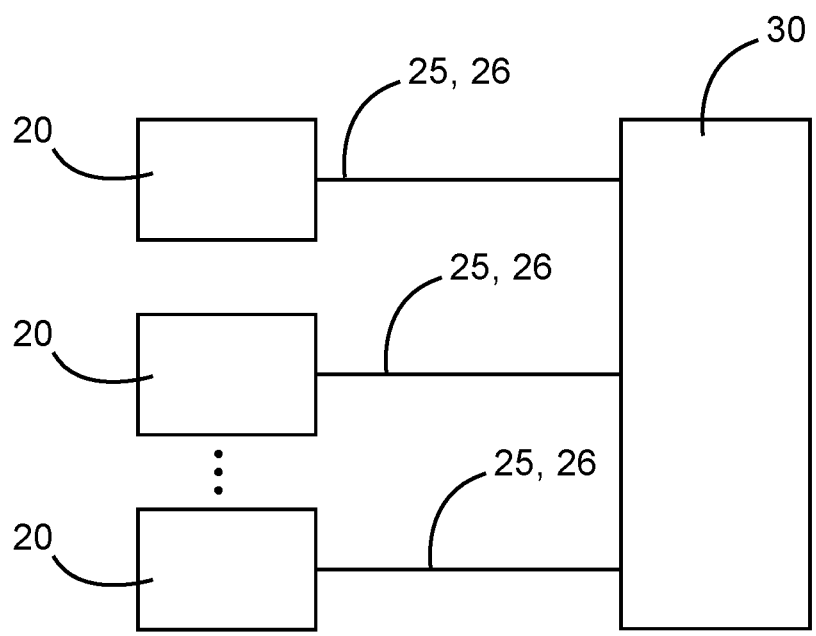
FIG. 2 shows a schematic illustration of part of an RF assembly.

FIG. 2 shows an exemplary connection of a plurality of signal sources 20 to a single impedance matching filter 30. An arbitrary number of signal sources (predefined by the available structural space and the requirements in respect of the level of the signal) can be connected to the impedance matching filter, the connection between the signal sources 20 and the impedance matching filter 30 being configured in the way that it is configured in FIG. 1 with reference to the transmission path 25 and the capacitive coupling element 26.

The circuit in FIG. 2 serves to attain higher power levels. However, it is also conceivable for a plurality of impedance matching filters 30 to be connected to one another on the output side in order to increase the power level that is output.

Figure 3:
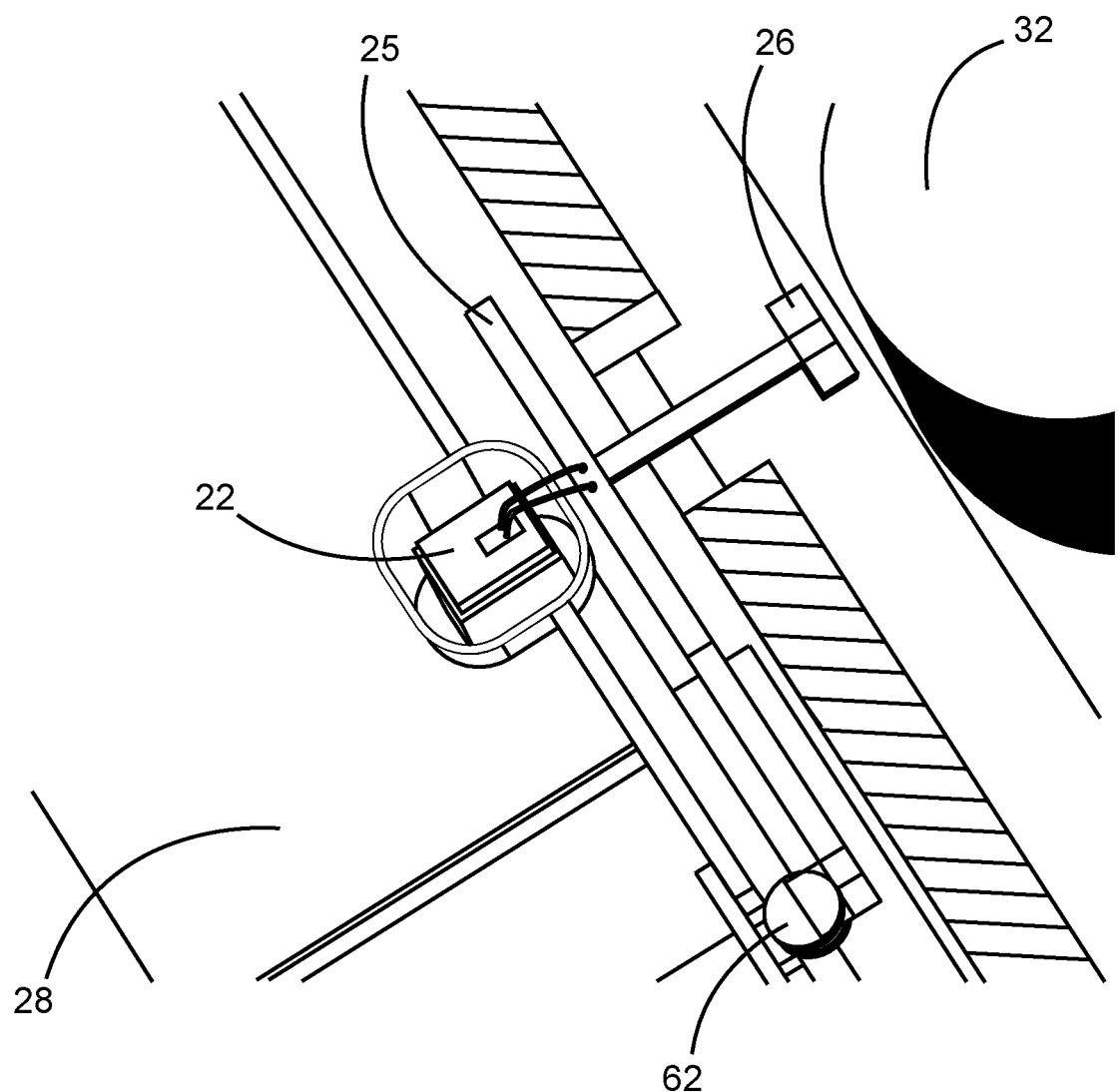
FIG. 3 shows a schematic illustration of the connection between an RF amplifier output and an impedance matching filter.

FIG. 3 shows a detail view of the semiconductor amplifier output 22 connected to the transmission path 25 by means of two lines. The semiconductor amplifier output 22 is arranged on a baseplate 28. A connecting line 62 for the direct-current supply of the semiconductor amplifier output 22 is connected to the transmission path 25. The transmission path 25 transitions to the capacitive coupling element 26. An RF signal is output from the semiconductor amplifier output 22 to the transmission path 25, then propagates thereon in the direction of the capacitive coupling element 26, from where the RF signal is fed into the impedance matching filter capacitively. Only a resonator 32 of the impedance matching filter is shown in FIG. 3. A gap is discernible between the resonator 32 and the capacitive coupling element 26.

The direct-current supply for the semiconductor amplifier output 22 is fed to the corresponding transistor as drain voltage and is effected for example via a PCB-integrated filter, in combination with discrete capacitances. Alternatively, the filter can also be realized by a lambda/4 line with parallel capacitance. In the present case, the drain voltage is connected to the transmission path 25 and can also be connected to any other region of the line to the filter.

FIG. 4 shows a larger section of an RF assembly, the RF assembly shown in FIG. 4 corresponding to the RF assembly from FIG. 3 in terms of its construction. FIG. 4 shows a power source 60, which makes electrical energy available to the semiconductor amplifier output 22. The semiconductor amplifier output 22 outputs an RF signal via the transmission path and the capacitive coupling element, said RF signal propagating along the signal propagation direction 36 in the impedance matching filter 30. The impedance matching filter 30 has, arranged one behind another in the signal propagation direction 36, a plurality of resonators 32 (these are cylindrical pedestals in the example in FIG. 4) and windows 34 (cross-sectional constrictions) between the resonators.

In the variant shown in FIGS. 3 and 4, the matching is produced by way of a cavity filter structure in the impedance matching filter configured as a hollow waveguide. In principle, all known filter topologies and filter types are appropriate for this (rectangular/round hollow waveguide filters, coaxial filters, dielectric filters). A four-circuit coaxial filter is shown by way of example.

The impedance matching filter 30 is detuned in the development process such that it offers the desired matching according to magnitude and phase at the first interface 31 to the transistor of the semiconductor amplifier output 22. The matching can be determined by means of a so-called load pull measurement or simulation, for example. Consequently, the impedance matching filter is not able to be used as an individual filter, but if it is operated at the output of the transistor of the semiconductor amplifier output 22, it allows the latter to be operated at its optimum operating point (e.g. best efficiency relative to the power matching). In addition to producing the required matching for the semiconductor amplifier output, the impedance matching filter 30 in combination with the transistor of the semiconductor amplifier output 22 also has a frequency-selective effect. A dedicated output filter can be obviated. This in turn improves the efficiency since additional filter losses do not have to be taken into account. The number of circuits and the topology of the impedance matching filter then depend on the requirements in respect of the output filter; it is possible to use filters with and without transmission zeros and with and without group delay equalization, typical numbers of circuits being 1-circuit to 14-circuit or more (in a practical application more likely 4-circuit to 12-circuit). The input coupling of the RF signal into the impedance matching filter is effected capacitively via PCB, ceramic or coaxial structure (for example through a discretely fabricated internal conductor with insulator material). PCB or ceramic has the advantage of simpler and cost-effective fabrication, and the coaxial structure yields the best efficiency (low losses).

In principle, inductive input coupling into the impedance matching filter is also conceivable, of course, but a dedicated DC block (e.g. capacitor or PCB structure) is necessary in such a case.

In the example shown, the connection of the transistor of the semiconductor amplifier output to the input coupling structure into the impedance matching filter is produced by bond wires (first line 23, second line 24, see FIG. 3). The transistor of the semiconductor amplifier output can be seated in a cutout of the PCB directly on the housing or a spacer, but also directly on the PCB or a ceramic. The transistor can be (conductively) adhesively bonded or soldered, with silver sintering or similar connection techniques likewise being conceivable.

FIG. 5 shows an RF assembly with a plurality of paths or branches. Via an input interface 18, a signal is passed to the baseplate 28, where the signal is processed and/or amplified. The plurality of impedance matching filters 22A, 22B, 22C, 22D each output a signal to a path of the impedance matching filter 30.

FIG. 6 shows a cross-sectional illustration of a single path from FIG. 5. The power source 60, the signal source 20 and an impedance matching filter 30 together with the signal propagation direction 36 are shown. In the impedance matching filter 30, four resonators 32A, 32B, 32C, 32D are arranged one behind another and in a manner spaced apart from one another in the signal propagation direction 36. It is evident that the resonators have a different height. Besides a different height, however, the resonators can also deviate from one another in terms of other properties, e.g. shape, diameter, etc. This deviation is used to attain a targeted detuning of the impedance matching filter in order that the input-side impedance and the output-side impedance deviate from one another with power matching to the semiconductor amplifier output on the input side and to the RF waveguide on the output side.

Figure 7:
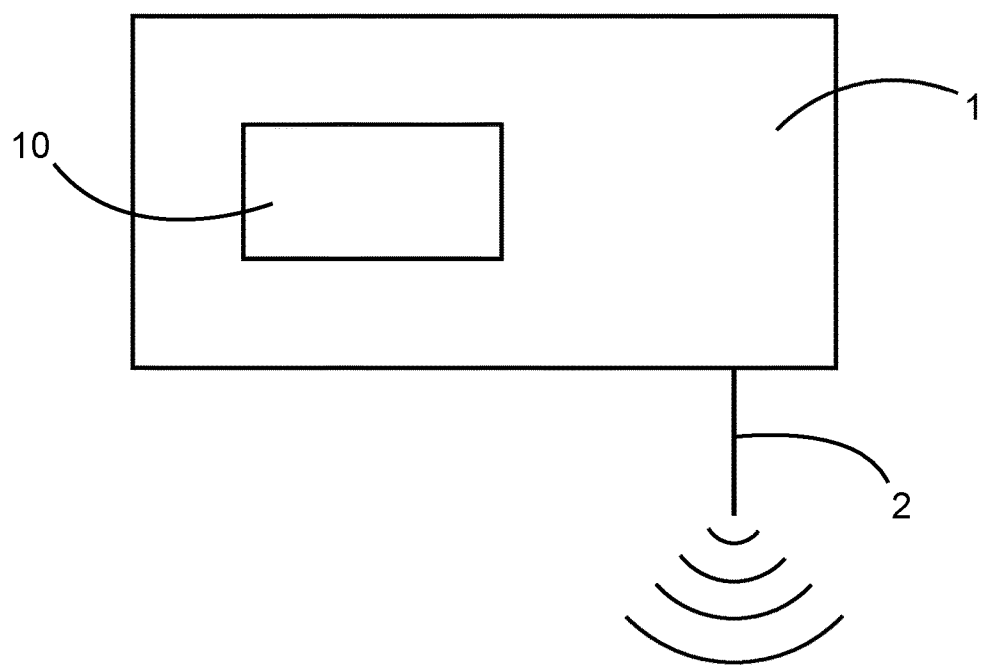
FIG. 7 shows a schematic illustration of a satellite with an RF assembly and an antenna.

FIG. 7 shows a schematic illustration of a communication satellite 1. A radio-frequency assembly 10 is arranged in the communication satellite 1. The radio-frequency assembly 10 can be part of a signal transmission path in the communication satellite. By way of example, the radio-frequency assembly 10 can output a signal to a transmission unit 2 in the form of an antenna.

The radio-frequency assembly described herein is suitable in particular for the signalling-related linking of transistor amplifiers or generally semiconductor amplifiers (SSPA) to an antenna.

FIG. 8 shows an RF assembly 10 with an impedance matching filter using ridge hollow waveguide technology. For the general construction and function of the RF assembly 10, reference is made to the description of FIGS. 1 to 7 above.

In the variant in FIG. 8, the impedance matching filter uses a hollow waveguide with a ridge 80 for matching purposes. The ridge 80 is subdivided into a plurality of ridge sections 80A, 80B, 80C, 80D. The ridge 80 is configured differently in the ridge sections. From a functional perspective, this corresponds to the differently configured resonators as shown in FIG. 6, for example.

The baseplate 28 bears the semiconductor amplifier output 22 and is covered by a cover 75.

In the variant in FIG. 8, the feeding of direct current for the operation of the semiconductor amplifier output and the capacitive coupling to the impedance matching filter are effected as described above. The RF signal couples into the ridge hollow waveguide of the impedance matching filter via a slot 71 in the PCB; at said waveguide, ridge sections with a plurality of mutually differently configured steps are arranged (corresponding to line sections with different characteristic impedances) and provide for the corresponding matching of the input-side and output-side impedances of the impedance matching filter.

Figure 9:
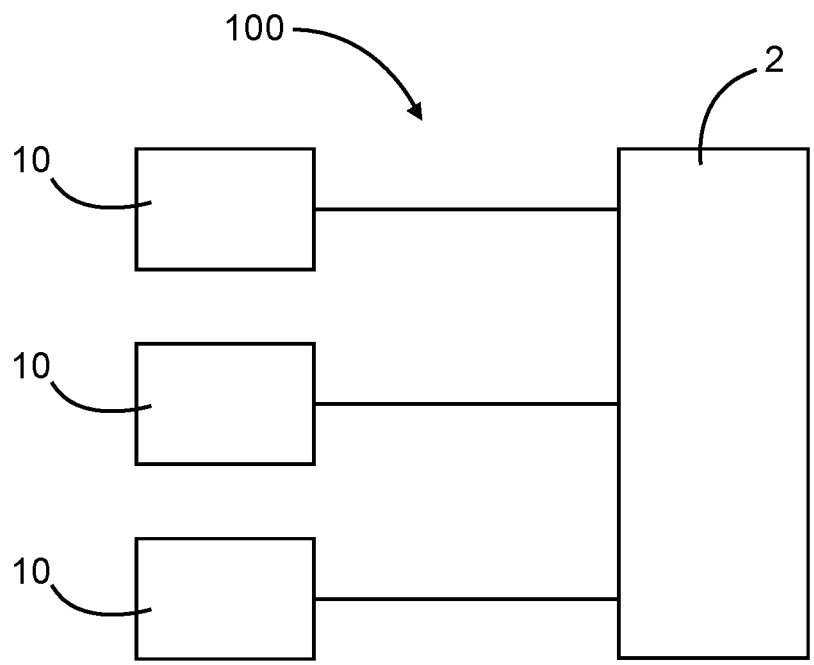
FIG. 9 shows a schematic illustration of an antenna arrangement.

Finally, FIG. 9 shows an antenna arrangement 100 with a plurality of RF assemblies 10 connected to an antenna 2. This antenna arrangement 100 can be used in communication satellites, for example.

It is supplementarily pointed out that "comprising" or "having" does not exclude other elements or steps and "a (n)" or "one" does not exclude a plurality. Furthermore, it should be pointed out that features or steps that have been described with reference to one of the exemplary embodiments above can also be used in combination with other features or steps of other exemplary embodiments described above. Reference signs in the claims should not be regarded as a limitation.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

1 Satellite
2 Transmission unit, antenna
10 Radio-frequency assembly
18 Input interface
20 Signal source
21 Amplifier unit
22 Semiconductor amplifier output (semiconductor, transistor)
23 First line
24 Second line
25 Transmission path (line, conductor track on circuit board)
26 Capacitive coupling element
28 Baseplate
29 Gap, galvanic isolation
30 Impedance matching filter
31 First interface
32 Resonator
34 Window
36 Signal propagation direction, transmission direction
39 Second interface
40 Coupling unit
50 Radio-frequency waveguide (hollow waveguide, ridge hollow waveguide, coaxial line)
60 Power source (DC energy supply)
61 DC filter
62 Connecting line
71 Coupling slot
75 Cover
80 Ridge
80A. 80B. 80C Ridge section
100 Antenna arrangement

The invention claimed is:

1. A radio-frequency assembly ("RF assembly") comprising:
a signal source having a semiconductor amplifier output;
at least one impedance matching filter with a first interface and a second interface; and
a radio-frequency waveguide ("RF waveguide");
wherein the first interface is communicatively coupled to the signal source for transmitting an RF signal from the signal source to the at least one impedance matching filter;
wherein the second interface is communicatively coupled to the RF waveguide for transmitting the RF signal from the at least one impedance matching filter to the RF waveguide;
wherein a first impedance value at the first interface corresponds to an impedance value at the semiconductor amplifier output;
wherein a second impedance value at the second interface corresponds to an impedance value at the RF waveguide; and
wherein the first impedance value and the second impedance value have different values.

2. The RF assembly according to claim 1, wherein the semiconductor amplifier output has a lower impedance value than that of the RF waveguide.

3. The RF assembly according to claim 1, wherein the at least one impedance matching filter is configured as a hollow waveguide with at least one resonator and/or at least one window.

4. The RF assembly according to claim 3, wherein the at least one impedance matching filter has a plurality of resonators and/or a plurality of windows arranged one behind another along a signal propagation direction in the at least one impedance matching filter.

5. The RF assembly according to claim 4, wherein the plurality of resonators arranged one behind another along the signal propagation direction differ from one another in terms of their geometry along the signal propagation direction.

6. The RF assembly according to claim 1, wherein the at least one impedance matching filter is configured as a hollow waveguide with one ridge.

7. The RF assembly according to claim 6, wherein said one ridge has a plurality of ridge sections having different geometries.

8. The RF assembly according to claim 1, further comprising a baseplate;
wherein the semiconductor amplifier output is arranged on the baseplate and is galvanically coupled via one or more lines to a transmission path on the baseplate; and
wherein the transmission path has a capacitive coupling element situated opposite the first interface and arranged for capacitively coupling the RF signals into the first interface.

9. The RF assembly according to claim 8, further comprising a power source, galvanically coupled to the transmission path and embodied for passing an energy supply in the form of direct current ("DC") onto the transmission path and providing the energy supply via said one or more lines to the semiconductor amplifier output.

10. The RF assembly according to claim 9, wherein the power source has a DC filter configured to be non-transmissive for the RF signals on the transmission path.

11. The RF assembly according to claim 1, having a plurality of semiconductor amplifier outputs capacitively coupled to the first interface of the at least one impedance matching filter.

12. The RF assembly according to claim 1, wherein the at least one impedance matching filter comprises a plurality of impedance matching filters, each of which is coupled to at least one semiconductor amplifier output; and
wherein the plurality of impedance matching filters are coupled to the RF waveguide.

13. The RF assembly according to claim 1, wherein the RF waveguide is a hollow waveguide, a ridge hollow waveguide, or a coaxial conductor.

14. An antenna arrangement, comprising:
an antenna; and
a plurality of RF assemblies according to claim 1;
wherein the plurality of RF assemblies are connected to the antenna to transmit a useful signal to the antenna.

15. A communication satellite, comprising an antenna arrangement according to claim 14.

\* \* \* \* \*